June 8, 1965 A. D. RITTMANN 3,188,536

SILICON RECTIFIER ENCAPSULATION

Filed Nov. 14, 1960

INVENTOR.

Albert D. Rittmann

BY

Robert E. Fowler

ATTORNEY

United States Patent Office 3,188,536
Patented June 8, 1965

3,188,536
SILICON RECTIFIER ENCAPSULATION

Albert D. Rittmann, Kokomo, Ind., assignor to General Motors Corporation, Detroit, Mich., a corporation of Delaware Filed Nov. 14, 1960, Ser. No. 68,907
4 Claims. (Cl. 317—234)

This invention relates to semiconductor rectifier means and more particularly to a method of and means for encapsulating and mounting high power rectifiers.

High power rectifiers, particularly of the silicon type, are finding a large variety of uses in industry. These rectifiers carry a relatively high current and, therefore, the temperature range between the off cycle and normal use is substantial. Since the silicon slab or wafer used in these devices is thin and brittle, mounting means must be provided that compensate for temperature variation so that mechanical stress will not be introduced by the temperature change and the crystals will not be cracked. Also that basic rectifier unit should be protected against general mechanical damage.

It is, therefore, an object in making this invention to provide a method of and means for encapsulating a high power semiconductor rectifier.

It is a further object in making this invention to provide protective encapsulation means for high power silicon rectifiers which compensates for temperature variation.

With these and other objects in view which will become apparent as the specification proceeds, my invention will be best understood by reference to the following specification and claims and the illustrations in the accompanying drawings, in which:

Figure 3:
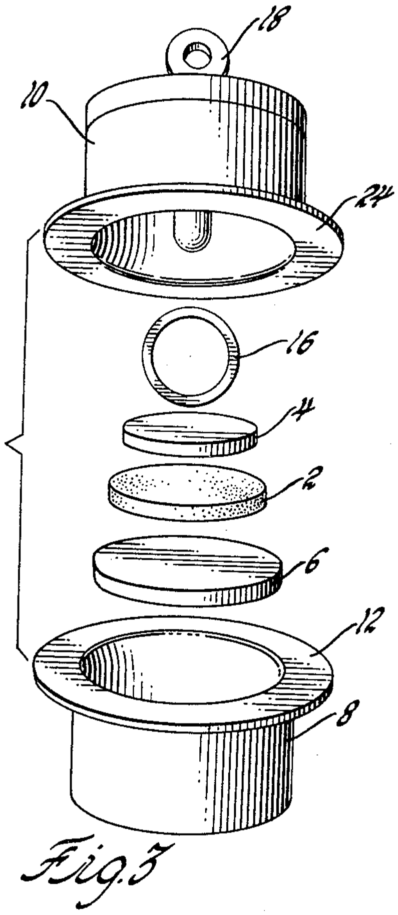
FIG. 3 is an exploded perspective view of the parts of the rectifier encapsulation unit; and, FIG. 4 is a side elevation with parts broken away and shown in section of the rectifier unit applied to one form of mounting means.

Referring first to FIG. 3 there is shown therein at 2 a semiconductor rectifier unit. This may be, for example, a silicon wafer which has been prepared through diffusion or some other method to embody a PN junction or complete rectifier component. On each side of the rectifier component there is provided a sheet of molybdenum as shown at 4 and 6, respectively, for purposes to be described. The main housing is formed of two mating cupped halves, a bottom cup-shaped member 8 and a top half member 10. The lower housing half 8 is a stamping with a flange 12 at its upper edge. It is formed of any suitable electrical conductive material such, for example, as copper which is both a good electrical conductor and relatively easily mechanically formed into desired shapes.

Figure 1:
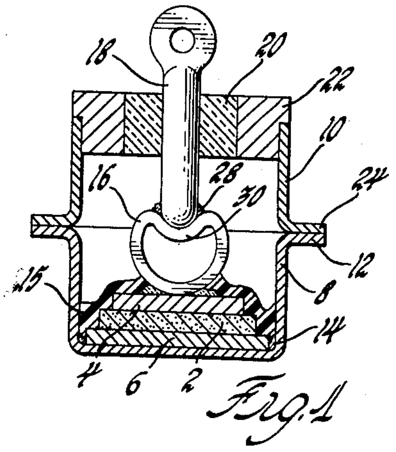
FIGURE 1 is a vertical sectional view taken through an encapsulation unit embodying my invention.

As mentioned above the silicon rectifier unit 2 will expand and contract with temperature changes. In order to prevent the application of mechanical forces to unit 2 due to mounting on a surface having some different coefficient of expansion, an intermediate layer of material having approximately the same coefficient of expansion is interposed. Molybdenum is a material which has substantially the same coefficient of expansion as silicon and the molybdenum sheets 4 and 6 are, therefore, used to sandwich the silicon rectifier between them in the final assembly. These three parts may be first, therefore, assembled by making the suggested sandwich through the use of suitable solder. The subassembly of 4, 2 and 6 is then secured to the bottom of the lower half of the housing 8 by soldering, such as is shown at 14 in FIG. 1. There remain, of course, certain exposed surfaces of the silicon rectifier 2 and at this point the assembly is etched and rinsed to cleanse all parts and assure no short circuits to the casing. Next, a circular conductive ring 16 is soldered in upright position to the upper surface of the top molybdenum sheet 4. This ring provides electrical connection to the rectifier unit and is adapted to engage the lower end of a terminal 18 supported by the upper housing half 10. After the ring 16 has been soldered to the upper surface of the molybdenum sheet 4 a suitable insulation potting compound 15 is flown in over the upper surface of the complete assembly in the bottom half of the housing to completely cover the rectifier unit. The lower subassembly is now complete.

Figure 2:
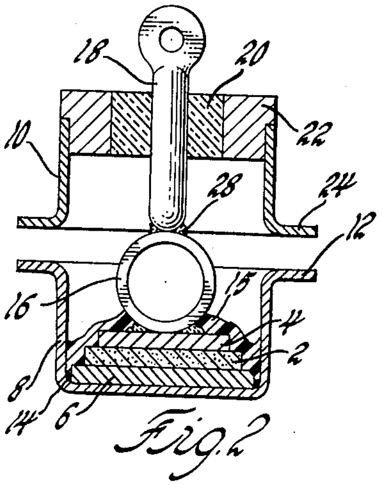
FIG. 2 is a similar vertical sectional view through an encapsulation unit showing the housing parts in spaced relation prior to joining the two main halves together.

The upper half of the housing consists of a glass seal 20 through which the upper terminal 18 extends. This glass seal is secured in a cylindrical metallic member 22 which has a lower flanged surface 24 adapted to lie opposite to the upper flange 12 on the lower half member 8. The lower end of the terminal 18 is then tinned with solder as shown at 28 and the two parts placed in juxtaposition as shown in FIG. 2. The unit is then placed in a temperature sufficient to melt the solder 28 to secure the terminal 18 to ring 16. Pressure is then applied to the two halves of the housing bringing the two flanges 24 and 12 into contact and causing a collapse of the upper surface of the ring 16 as shown at 30 and the lower end of the terminal 18 forcing a depression in the ring and providing electrical connection of the terminal 18 to the rectifying wafer. The shape of the ring makes it unnecessary to have close tolerances in measuring the dimensions of the various parts of the device but provides for a relatively large variation in sizes and still produces contact between the parts for electrical conduction.

Prior to bringing the flanges 24 and 12 together and while the solder 28 is being heated to become molten the area inside the unit can be flushed with any desired gas such, for example, as dry air. Once the solder has joined the parts and the unit collapsed together the flange assembly is then cold welded to hermetically seal the unit within the housing.

Figure 4:
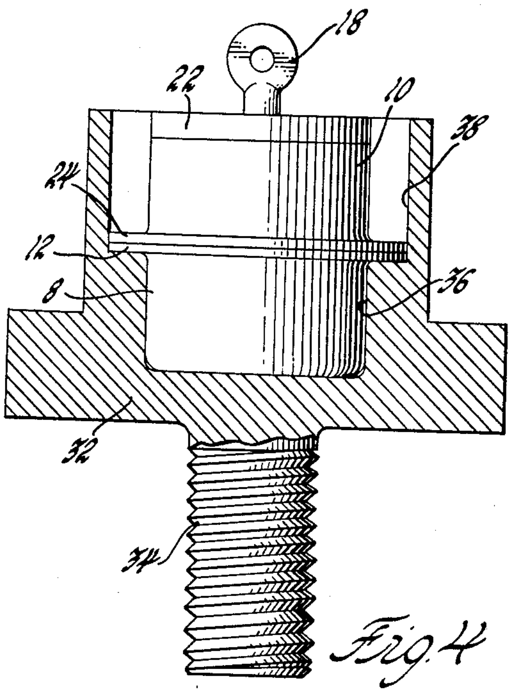

Having thus provided the basic rectifier unit, one terminal of which is the casing or housing itself and the other terminal is terminal 18, this unit can be used in various mounting means depending upon customer requirements. Purely as an example of a housing, FIG. 4 shows a circular member 32 having a threaded mounting stud 34 protruding from the lower base and having its upper surface bored out at 36 and 38 so that the rectifier unit can be dropped into the opening and secured thereto. Thus the threaded stud 34 now becomes one terminal and the terminal 18 remains the other terminal of the rectifier.

What is claimed is:

1. In rectifier means, a semiconductor rectifier wafer, a sheet of electrically conductive material secured to each opposite face of said semiconductor rectifier wafer forming a sandwich, said electrically conductive material having substantially the same coefficient of expansion as the semiconductor rectifier wafer, a multi-part housing of electrically conductive material, said parts having flanges facing each other, said sandwich of the semiconductor rectifier wafer and the two sheets of electrically conductive material being secured within one part of the housing, a partially collapsed conductive ring secured to the available surface of the electrically conductive material in the one part of the housing, and a terminal insulatably mounted through the other part of the housing and adapted to deform the conductive ring substantially only in its contact area with said terminal when the two parts are brought together, said terminal protruding into said deformed area, said flanges being sealed together to form a hermetically sealed unit.

2. In rectifier means, a semiconductor rectifier wafer, a sheet of electrically conductive material secured to each opposite face of said semiconductor rectifier wafer forming a sandwich, said electrically conductive material having substantially the same coefficient of expansion as the semiconductor rectifier wafer, a multi-part housing of electrically conductive material, said parts having flanges facing each other, said sandwich of the semiconductor rectifier wafer and the two sheets of electrically conductive material being secured within one part of the housing, a partially collapsed conductive ring secured to the available surface of the electrically conductive material in the one part of the housing, insulating potting compound covering said exposed surfaces of the electrically conductive material and said semiconductive wafer in the one housing part, and an output terminal insulatably mounted in the other housing part and protruding inwardly to partially collapse the conductive ring when the housing parts are brought into juxtaposition but of sufficient length to engage the collapsible conductive ring before said housing parts are in full engagement so that when they are brought together to encapsulate the semiconductor rectifier wafer the output terminal will force the conductive ring inwardly to partially deform it, said ring being deformed substantially only in the contact area with said terminal and said terminal protruding into said deformed area and secured thereto.

3. A method of fabricating a durable high power rectifier comprising the steps of securing a rectifier body to a base member of a rectifier capsule, securing a collapsible conductive metal ring to said rectifier body, potting the rectifiier body and contigous portions of said ring on said base member with an insulating compound, spacing a cover member for said rectifier capsule from said base in register with the base, said cover member having a rectifier output terminal projecting inwardly toward said base that engages said collapsible conductive ring before the cover member contacts said base, bonding the inner end of the output terminal to the conductive ring, pressing the capsule members together under a protective atmosphere to deform said conductive ring against the inner end of the cover output terminal so that the terminal end protrudes into the deformed ring, and while under the protective atmosphere securing said cover to said base.

4. A method of fabricating a durable high power rectifier comprising the steps of securing a laminated rectifier assembly onto a base member of a rectifier capsule, securing a collapsible conductive metal ring to said rectifier laminate, potting the rectifier laminate and contiguous portions of said conductive ring on said base member with an insulating compound, spacing a cover member for the capsule from said base in register with the base, said cover member having a rectifier output terminal projecting inwardly toward said base that engages said collapsible conductive ring before the cover member contacts said base, heating said spaced members in a protective atmosphere to solder the inner end of the output terminal to the conductive ring, pressing the capsule members together under a protective atmosphere to deform said conductive ring against the inner end of the cover output terminal so that the terminal end protrudes into the deformed ring, and while under the protective atmosphere bonding said cover and base members together to hermetically seal said laminate within the capsule.

References Cited by the Examiner

UNITED STATES PATENTS

| | | | |
|---|---|---|---|
| 2,744,218 | 5/56 | Burton et al. | 317—234 |
| 2,829,422 | 4/58 | Fuller | 29—25.3 |
| 2,830,238 | 4/58 | Gudmundsen | 317—235 |
| 2,842,831 | 7/58 | Pfann | 29—25.3 |
| 2,853,661 | 9/58 | Houle et al. | 317—234 |
| 2,896,134 | 7/59 | Myer | 317—234 |
| 2,921,245 | 1/60 | Wallace et al. | 317—235 |
| 2,931,958 | 4/60 | Arthur et al. | 317—234 |
| 2,937,324 | 5/60 | Kroko | 317—234 |
| 2,993,153 | 7/61 | Wagner | 317—234 |
| 3,065,390 | 11/62 | Boswell et al. | 317—234 |

DAVID J. GALVIN, *Primary Examiner.*

SAMUEL BERNSTEIN, JAMES D. KALLAM, *Examiners.*